United States Patent [19]

Mödl et al.

[11] Patent Number: 5,842,274
[45] Date of Patent: Dec. 1, 1998

[54] METHOD OF FORMING DISCRETE SOLDER PORTIONS ON RESPECTIVE CONTACT PADS OF A PRINTED CIRCUIT BOARD

[75] Inventors: Albert Mödl, Stadtbergen; Joachim Schütt, Neusäss, both of Germany

[73] Assignee: NCR Corporation, Dayton, Ohio

[21] Appl. No.: 523,566

[22] Filed: Sep. 5, 1995

Related U.S. Application Data

[63] Continuation of Ser. No. 164,976, Dec. 10, 1993, abandoned.

[30] Foreign Application Priority Data

Feb. 5, 1993 [GB] United Kingdom ............... 9302228

[51] Int. Cl.$^6$ .................................................. H05K 3/34
[52] U.S. Cl. ........................... 29/840; 29/843; 228/56.3; 228/180.21
[58] Field of Search .................. 29/840, 843; 219/85.13, 219/85.22; 228/180.1, 180.21, 56.3

[56] References Cited

U.S. PATENT DOCUMENTS

| | | | |
|---|---|---|---|
| 3,592,992 | 7/1971 | Costello | 219/85.13 |
| 3,750,265 | 8/1973 | Cushman | 228/180.21 |
| 3,836,745 | 9/1974 | Costello | 219/85.22 |
| 4,728,022 | 3/1988 | Jamison | 228/180.21 X |
| 4,884,335 | 12/1989 | McCoy et al. | 228/180.1 X |
| 4,937,934 | 7/1990 | Devera et al. | 29/840 |
| 5,180,097 | 1/1993 | Zenshi | 228/180.21 |

OTHER PUBLICATIONS

Patent Abstract of Japan, E–1182, Mar. 26, 1992, vol. 16, No. 120.

Patent Abstract of Japan, E–795, Jul. 28, 1989, vol. 13, No. 338.

*Primary Examiner*—Peter Vo
*Attorney, Agent, or Firm*—James H. Beusse; Albert L. Sessler, Jr.

[57] ABSTRACT

The invention provides for a method of forming discrete solder portions (16) on respective contact pads (10) whereby a strip of solder paste (12) is formed over a plurality of said pads (10). The strip (12) is formed with portions of reduced width (14) which are located over the spaces (22) between adjacent pads (10). The paste is melted and the surface tension at the portions of reduced width (14) causes the movement of solder towards the pads (10) and the separation of the strip (12) into discrete solder portions (16).

7 Claims, 1 Drawing Sheet

METHOD OF FORMING DISCRETE SOLDER PORTIONS ON RESPECTIVE CONTACT PADS OF A PRINTED CIRCUIT BOARD

This is a continuation of application Ser. No. 08/164,976, filed Dec. 10, 1993 now abandoned.

BACKGROUND OF THE INVENTION

The present invention relates to a method of forming discrete solder portions on respective contact pads of a printed circuit board.

Printed circuit boards (PCBs) that are arranged to rceive surface mounted components are provided with a plurality of contact pads upon which the components are to be mounted. Electrical connectors or leads of the components are soldered on to the contact pads of the PCB so as to form the electrical and mechanical connection of each device to the PCB. Solder is commonly applied to the contact pads in the form of solder paste, and the connectors of the components are then located on the pads. A so-called "reflow" process is then initiated in which the solder paste is first melted and then solidified, so as to bond the connectors of the components to the pads.

Technological developments have led to an increase in the number of connectors per surface mounted component, so that the distance between adjacent connectors of the components, the so-called pitch, has decreased. The decrease in pitch of the surface mounted components has necessitated a corresponding decrease in the distance between, or the pitch of, the contact pads of the PCB.

Surface mounted components with a pitch of 0.635 mm and above can be accurately mounted and connected to the contact pads of a PCB using a known soldering method. In this known method, discrete solder paste portions for the respective pads are applied by means of a stencil having a pattern of apertures corresponding to the pattern of contact pads on the PCB. Thus, the pitch of the apertures of the stencil corresponds, with some degree of tolerance, to that of the pads of the PCB.

This known method is disadvantageous in that it is difficult to provide for the surface mounting of a component having a pitch less than 0.635 mm, since, due to tolerance restrictions in width and location of the stencil apertures, the solder paste cannot be located with the required accuracy on contact pads having a pitch less than 0.635 mm without the risk of the occurrence of solder short circuits.

Thus, the known method disadvantageously inhibits use of surface mounted components having a connector pitch less than 0.635 mm, and components which can be mounted on a PCB.

SUMMARY OF THE INVENTION

According to the present invention, there is provided a method of forming discrete solder portions on respective contact pads of a printed circuit board for surface mounting electrical components thereon, characterized by forming a strip of solder paste over said pads, said strip having a plurality of portions of reduced width spaced along its length and being located over said pads such that portions of reduced width overlay the spaces between said pads, and melting said paste so that surface tension at said portions of reduced width causes the melted paste overlaying said spaces to flow towards said pads and so separate said strip into a plurality of discrete solder portions.

The invention is advantageous in that the strip of solder paste can be accurately formed with portions of reduced width so that solder paste can be accurately located on contact pads having a pitch of less than 0.635 mm without the formation of solder shorts. A further advantage arises since the solder paste can be located with less accuracy than needed with known methods, since the surface tension will separate the strip and lead to accurate location of the solder portions. The invention also improves the accuracy with which solder can be applied to contact pads having a pitch equal to, or greater than, 0.635 mm.

It is accordingly an object of the present invention to provide a method of forming discrete solder portions on respective contact pads of a printed circuit board.

It is another object of the present invention to provide a method of forming discrete solder portions on respective contact pads which does not suffer the disadvantage of inhibiting the use of surface mounted components having a connector pitch of less than 0.635 mm.

Additional benefits and advantages of the present invention will become apparent to those skilled in the art to which this invention relates from the subsequent description of the preferred embodiment and the appended claims, taken in conjunction with the accompanying drawings.

DETAILED DESCRIPTION

Figure 1:
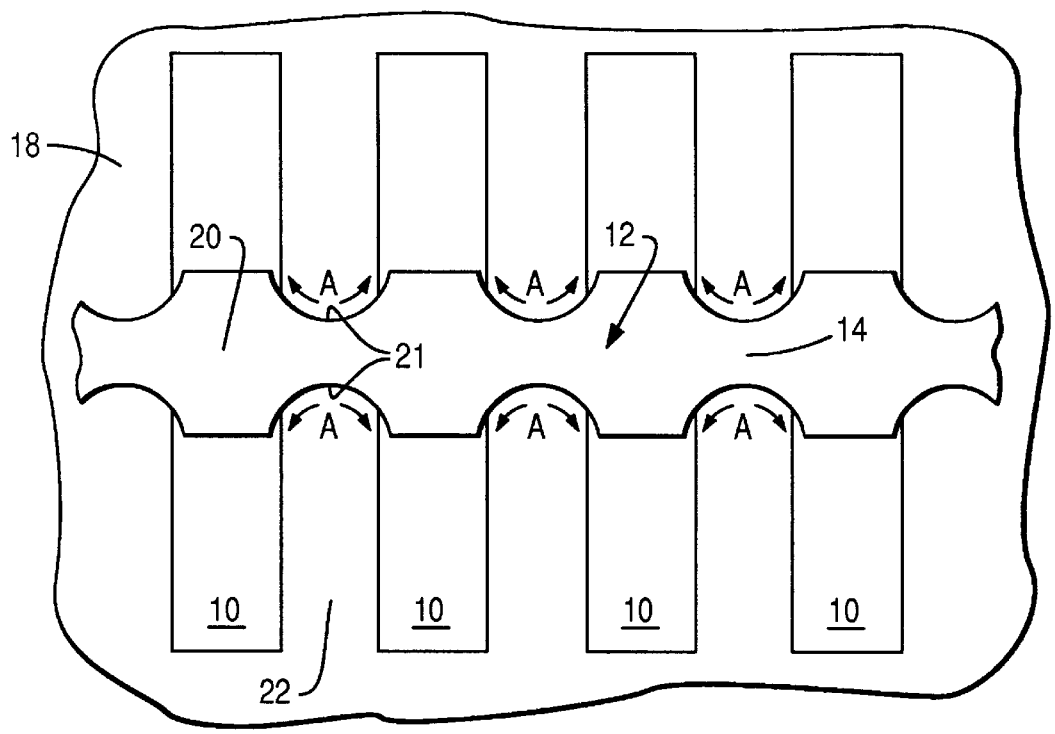
FIG. 1 is a plan view of a row of contact pads of a PCB having a solder paste strip located thereover.

FIG. 1 shows a plurality of contact pads 10 provided on a PCB 18 for the surface mounting thereon of an electrical component (not shown) such as an integrated circuit chip. As such, the contact pads 10 form part of one side of a so-called "foot print" which indicates the location at which the component is to be mounted by way of connectors provided on the component.

A strip of solder paste 12 is deposited over the contact pads 10 by means of a stencil having an aperture corresponding to the shape of the strip 12. The solder paste strip 12 has a series of portions of reduced width, so-called necks, 14 along its length, the necks 14 being separated so that they overlay the spaces between adjacent contact pads 10. Thus, the portions 20 of the solder strip 12 are respectively located on the contact pads 10. Preferably, each neck 14 is formed by mutually opposed concave recesses 21 respectively formed in the opposite edges of the strip. It should be understood that only part of the solder strip 12 and only some of the pads 10 associated with the electrical component are shown in FIG. 1. Thus, for example, the "foot print" could comprise 64 pads on one side.

Once the solder paste strip 12 has been applied to the PCB 18, as shown in FIG. 1, the PCB 18 is ready for the surface mounting of the electrical component. The component is placed such that its connectors are located on the footprint formed by the pads 10 so that the component is then supported on the pads 10 and the portions 20 of the paste strip 12.

The whole structure is then heated such that the solder paste strip 12 is caused to melt according to the known reflow process.

Figure 2:
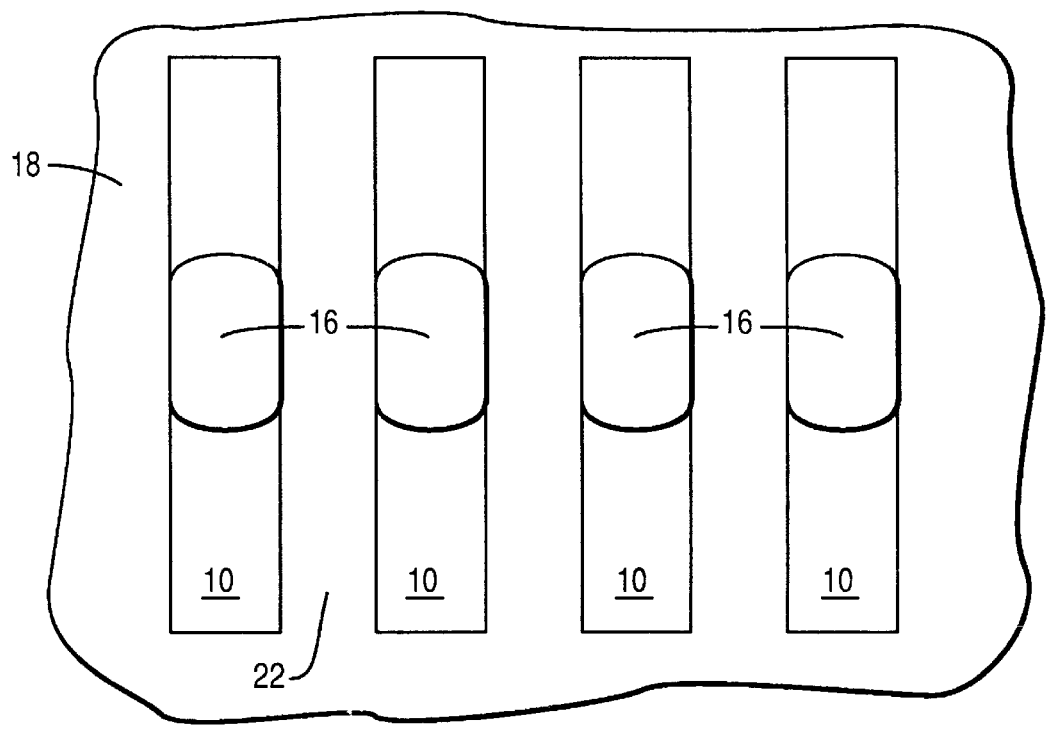
FIG. 2 is a plan view of the contact pads of FIG. 1 after reflow.

Once melted, the solder at the necks 14 moves, due to surface tension, in the direction of arrows A towards the contact pads 10 and results in the separation of the solder strip 12 at the necks 14 such that discrete portions of solder 16 are formed on the contact pads 10 as shown in FIG. 2. Upon solidification of the solder, the surface mounted component is connected to the contact pads 10 by means of the discrete solder portions 16.

Thus, the movement of the solder, as indicated by the arrows A in FIG. 1, under the influence of surface tension, is initiated by the neck 14 of the solder strip 12. The advantages of the present invention are achieved because the wider portions 20 of the strip 12 can be accurately formed at a pitch of less than 0.635 mm since a single aperture, having wider portions at a pitch of less than 0.635 mm can be accurately formed in a stencil, and the paste applied over the contact pad 10 to accurately correspond to that shape. In the prior art, discrete apertures cannot easily be provided in width and location in a stencil, and the paste accurately applied thereby, at pitches less than 0.635 mm.

The invention is not restricted to the details of the foregoing embodiment. For example, the neck portions 14 can be provided in other, and in particular non-symmetrical, forms.

Preferably, the melting of the solder strip 12 takes place with connectors of an electrical component positioned on said pads so that bonding of said connectors of said component takes simultaneously with the formation of said discrete solder portions 16.

By using the method described above, it has been found that components can be mounted on pads having a pitch of 0.5 mm or less without the risk of solder shorts occurring.

Although the invention has been described with particular reference to a preferred embodiment thereof, variations and modifications of the present invention can be effected within the spirit and scope of the following claims.

What is claimed is:

1. A method of forming discrete solder portions on a plurality of closely spaced contact pads of a printed circuit board for surface mounting electrical components thereon, comprising the steps:

employing a stencil to deposit a continuous strip of solder paste over said pads and the spaces therebetween, said strip having portions of reduced width along its length in correspondence with the spaces between said pads, at least some of said pads being spaced from adjacent ones of said pads by a distance of less than 0.635 mm; and melting said paste so that the portions of reduced width flow toward adjacent ones of said pads to separate said strip into discrete solder portions positioned on respective ones of said pads.

2. A method of surface mounting leads of an electrical component to a circuit board, comprising the steps:

providing a plurality of contact pads on said board with the distance between adjacent pads being less than 0.635 mm;

providing a stencil with an elongated aperture with portions of reduced width along its length;

depositing a continuous strip of solder paste over said pads by means of said stencil so that portions of reduced width of solder paste are aligned with spaces between said pads;

positioning said component so that its leads are supported on said pads and solder paste; and melting said paste so that it flows towards said pads to separate said strip into discrete portions of solder positioned on said pads, thereby connecting said leads to said pads.

3. The method of claim 2, wherein the distance between adjacent contact pads is less than 0.5 mm.

4. The method of claim 2 wherein said portions of reduced width of solder paste are defined by mutually opposed, substantially semicircular recesses.

5. A method of connecting an electrical component having a plurality of leads with a pitch of less than 0.635 mm to respective contact pads on a circuit board, said component connected to said board by the steps:

depositing a continuous strip of solder paste over said pads by means of a stencil so that portions of reduced width of solder paste are aligned with spaces between said pads;

positioning said component so that said leads are supported on said pads and solder paste, respectively; and melting said paste so that it flows towards said pads to separate said strip into discrete portions of solder positioned on said pads, thereby connecting said leads to said pads.

6. The method as recited in claim 5, wherein said leads have a pitch of less than 0.5 mm.

7. The method of claim 5 wherein said portions of reduced width of solder paste are defined by mutually opposed, substantially semicircular recesses.

* * * * *